United States Patent
Liu

(10) Patent No.: US 9,698,969 B1
(45) Date of Patent: Jul. 4, 2017

(54) HALF-RATE CLOCK DATA RECOVERY CIRCUIT

(71) Applicant: Realtek Semiconductor Corp., Hsinchu (TW)

(72) Inventor: Jian Liu, Suzhou (CN)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/292,934

(22) Filed: Oct. 13, 2016

(30) Foreign Application Priority Data

Dec. 24, 2015 (CN) .......................... 2015 1 0982439

(51) Int. Cl.
H04L 7/02 (2006.01)
H03L 7/099 (2006.01)
H03L 7/08 (2006.01)
H03L 7/093 (2006.01)

(52) U.S. Cl.
CPC .............. *H04L 7/02* (2013.01); *H03L 7/0807* (2013.01); *H03L 7/093* (2013.01); *H03L 7/099* (2013.01)

(58) Field of Classification Search
CPC ......... H04L 7/02; H03L 7/0807; H03L 7/093; H03L 7/099
See application file for complete search history.

(56) References Cited

U.S. PATENT DOCUMENTS

| 7,664,215 | B2* | 2/2010 | Jaussi | H03L 7/07 375/375 |
| 9,379,921 | B2* | 6/2016 | Wang | H04L 25/03057 |
| 2006/0140321 | A1* | 6/2006 | Tell | H03L 7/0814 375/376 |
| 2010/0322367 | A1* | 12/2010 | Wenske | H03L 7/0807 375/373 |
| 2015/0304097 | A1* | 10/2015 | Yu | H04L 7/0025 375/373 |

* cited by examiner

*Primary Examiner* — Janice Tieu
(74) *Attorney, Agent, or Firm* — Birch, Stewart, Kolasch & Birch, LLP

(57) ABSTRACT

A half-rate clock data recovery circuit includes: a voltage-controlled oscillator (VCO) for generating a data sampling clock and an edge sampling clock according to a control voltage; an adjusting circuit for dynamically controlling the VCO to adjust the phase difference between the data sampling clock and the edge sampling clock to be different from 90 degrees in multiple test periods; and a control circuit for instructing the adjusting circuit to respectively utilize different control value combinations to control the VCO in the multiple test periods, and for recording multiple recovered-signal quality indicators respectively corresponding to the multiple test periods. Afterwards, the control circuit instructs the adjusting circuit to utilize a control value combination corresponding to the best quality indicator among the multiple recovered-signal quality indicators to control the VCO.

6 Claims, 3 Drawing Sheets

HALF-RATE CLOCK DATA RECOVERY CIRCUIT

CROSS-REFERENCE TO RELATED APPLICATIONS

This application claims the benefit of priority to Patent Application No. 201510982439.3, filed in China on Dec. 24, 2015; the entirety of which is incorporated herein by reference for all purposes.

BACKGROUND

The disclosure generally relates to a half-rate clock data recovery circuit and, more particularly, to a half-rate clock data recovery circuit capable of dynamically adjusting signal delay of the sampling signal.

A voltage-controlled oscillator is typically employed in the conventional half-rate clock data recovery circuit to generate an in phase clock signal and a quadrature phase clock signal having 90 degrees phase difference with the in phase clock signal. In the conventional half-rate clock data recovery circuit, the in phase clock signal is utilized by a data sampling circuit as a data sampling clock of an input data, and the quadrature phase clock signal is utilized by an edge sampling circuit as an edge sampling clock of the input data. In theory, when the rising edge of the quadrature phase clock signal is aligned with the edge of the eye diagram of the input data, the rising edge of the in phase clock signal should be aligned with the central portion of the eye diagram of the input data. In this situation, the bit error rate of the half-rate clock data recovery circuit can be reduced by adopting the in phase clock signal to be the data sampling clock of the input data.

In the realistic environment, however, the eye diagram of the input data is often not an ideal symmetric eye due to the non-linear characteristic of the eye recovery circuit. Additionally, the hold time issue typically occurs in the conventional edge sampling circuit. Accordingly, utilizing the in phase clock signal and the quadrature phase clock signal that having 90 degrees phase difference with each other as sampling clocks often causes the sampling point of the input data to deviate from the best sampling point of the eye diagram when the loop is locked, thereby increasing the bit error rate of the half-rate clock data recovery circuit.

SUMMARY

An example embodiment of a half-rate clock data recovery circuit for providing a clock data signal to a data processing circuit is disclosed. The half-rate clock data recovery circuit comprises: a control voltage generating circuit arranged to operably generate a control voltage; a data sampling circuit arranged to operably conduct a data sampling operation on an input data based on a data sampling clock to generate the clock data signal; an edge sampling circuit arranged to operably conduct an edge sampling operation on the input data based on an edge sampling clock to generate an edge-sampled signal; a phase detection circuit, coupled with the control voltage generating circuit, the data sampling circuit, and the edge sampling circuit, arranged to operably compare data consistency of the clock data signal and the edge-sampled signal with respect to adjacent sampling points of time so as to control the control voltage generating circuit to adjust the control voltage; a voltage-controlled oscillator, coupled with the control voltage generating circuit, arranged to operably generate the data sampling clock and the edge sampling clock according to the control voltage; an adjusting circuit, coupled with the voltage-controlled oscillator, arranged to dynamically control the voltage-controlled oscillator to configure a phase difference between the data sampling clock and the edge sampling clock to be different from 90 degrees in multiple test periods; and a control circuit, coupled with the adjusting circuit, arranged to operably instruct the adjusting circuit to respectively utilize different control value combinations to control the voltage-controlled oscillator in the multiple test periods, and to operably record multiple recovered-signal quality indicators respectively corresponding to the multiple test periods and generated by the data processing circuit; wherein after the multiple test periods, the control circuit instructs the adjusting circuit to utilize a control value combination corresponding to a best quality indicator among the multiple recovered-signal quality indicators to control the voltage-controlled oscillator so as to reduce an error rate of the clock data signal.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
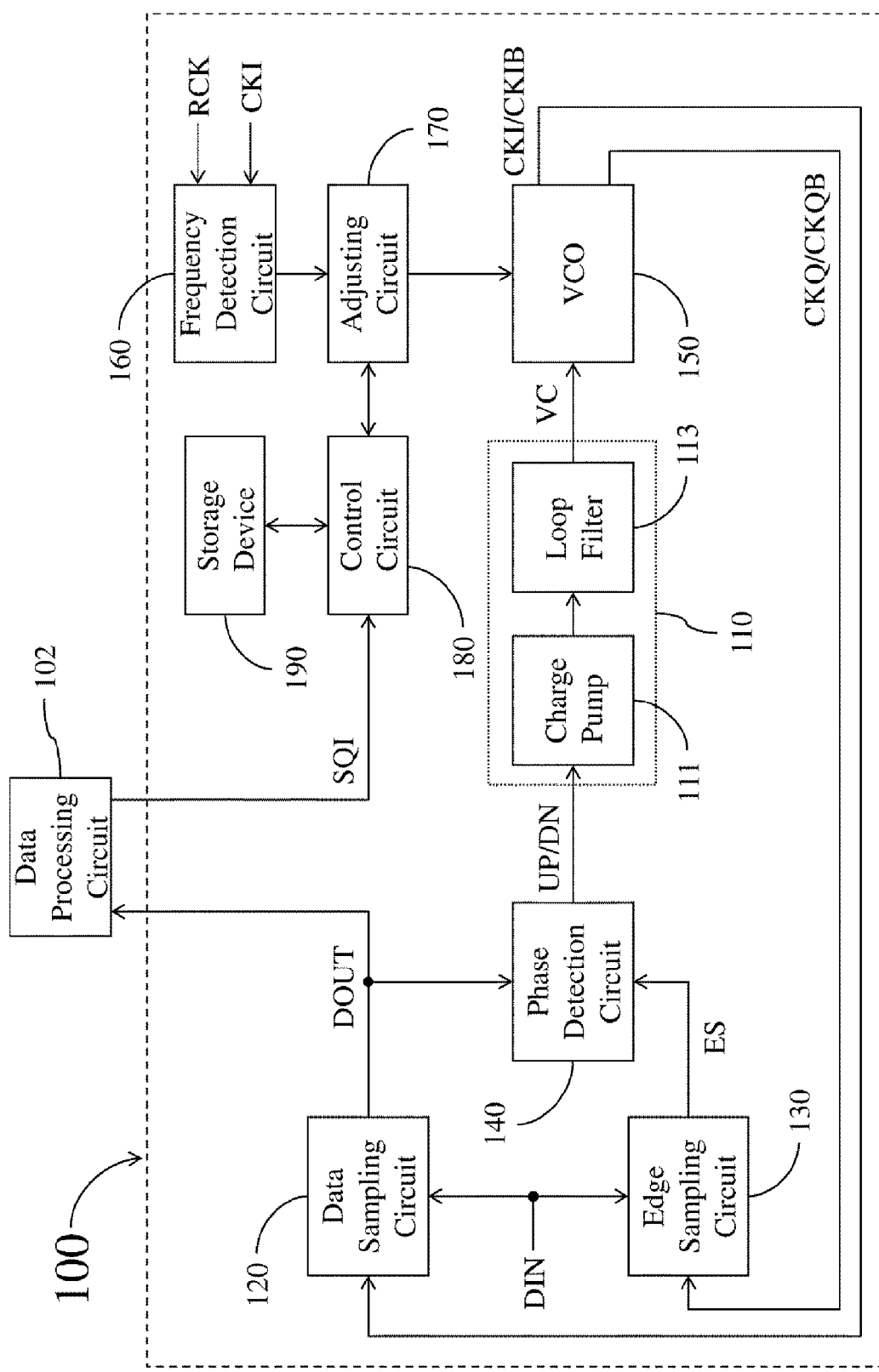
FIG. 1 shows a simplified functional block diagram of a half-rate clock data recovery circuit according to one embodiment of the present disclosure.

FIG. 1 shows a simplified functional block diagram of a half-rate clock data recovery circuit 100 according to one embodiment of the present disclosure. The half-rate clock data recovery circuit 100 is utilized for providing a clock data signal DOUT to a data processing circuit 102. As shown in FIG. 1, the half-rate clock data recovery circuit 100 comprises a control voltage generating circuit 110, a data sampling circuit 120, an edge sampling circuit 130, a phase detection circuit 140, a voltage-controlled oscillator 150, a frequency detection circuit 160, an adjusting circuit 170, a control circuit 180, and a storage device 190.

In the half-rate clock data recovery circuit 100, the control voltage generating circuit 110 is arranged to operably generate a control voltage VC. The data sampling circuit 120 is arranged to operably conduct a data sampling operation on an input data DIN based on a data sampling clock CKI to generate the clock data signal DOUT. The edge sampling circuit 130 is arranged to operably conduct an edge sampling operation on the input data DIN based on an edge sampling clock CKQ to generate an edge-sampled signal ES. The phase detection circuit 140 is coupled with the control voltage generating circuit 110, the data sampling circuit 120, and the edge sampling circuit 130. The phase detection circuit 140 is arranged to operably compare data consistency of the clock data signal DOUT and the edge-sampled signal ES with respect to adjacent sampling points of time so as to control the control voltage generating circuit 110 to adjust the magnitude of the control voltage VC.

In practice, the control voltage generating circuit 110 may comprise a charge pump 111 and a loop filter 113. The phase detection circuit 140 may generate consecutive up signals UP and down signals DN according to the comparison results of the data consistency of the clock data signal DOUT and the edge-sampled signal ES with respect to adjacent sampling points of time, so as to adjust the output voltage of the charge pump 111. The loop filter 113 is arranged to operably compensate and filter the output voltage of the charge pump 111 to generate a stable control voltage VC of the voltage-controlled oscillator 150.

In the half-rate clock data recovery circuit 100, the voltage-controlled oscillator 150 is coupled with the control voltage generating circuit 110, and arranged to operably generate the aforementioned data sampling clock CKI and edge sampling clock CKQ according to the control voltage VC.

The frequency detection circuit 160 is coupled with the voltage-controlled oscillator 150 and the adjusting circuit 170. The frequency detection circuit 160 is arranged to operably control the adjusting circuit 170 to adjust the oscillating frequency of the voltage-controlled oscillator 150 until a difference between the frequency of a reference clock RCK and the oscillating frequency of the voltage-controlled oscillator 150 is less than a predetermined threshold. The adjusting circuit 170 is coupled with the voltage-controlled oscillator 150, and arranged to dynamically control the voltage-controlled oscillator 150 to configure the phase difference between the data sampling clock CKI and the edge sampling clock CKQ to be different from 90 degrees in multiple test periods. The control circuit 180 is coupled with the adjusting circuit 170, and arranged to operably instruct the adjusting circuit 170 to respectively utilize different control value combinations to control the voltage-controlled oscillator 150 in the multiple test periods. The control circuit 180 is also arranged to operably record multiple recovered-signal quality indicators (RSQI), which are respectively corresponding to the multiple test periods and generated by the data processing circuit 102, in the storage device 190.

In practice, the output signal of the voltage-controlled oscillator 150 may be realized in the form of a single-ended signal or a pair of differential signals. For example, in some embodiments where the voltage-controlled oscillator 150 is required to provide differential output signals, the voltage-controlled oscillator 150 may generate differential data sampling clocks CKI and CKIB according to the control voltage VC, and also generate differential edge sampling clocks CKQ and CKQB according to the control voltage VC.

Additionally, the recovered-signal quality indicator RSQI generated by the data processing circuit 102 may be a bit error rate (BER), a quality of service (QOS), a signal-to-noise ratio (SNR), or any other quality indicators that can be used by the circuits in the later stage to evaluate the sampling accuracy of the input data DIN.

After the multiple test periods, the control circuit 180 may instruct the adjusting circuit 170 to utilize a control value combination corresponding to the best quality indicator among the multiple recovered-signal quality indicators to control the voltage-controlled oscillator 150 to thereby reduce the error rate of the clock data signal DOUT.

The operations of the half-rate clock data recovery circuit 100 will be further described in the following by reference to FIG. 2 and FIG. 3.

Figure 2:
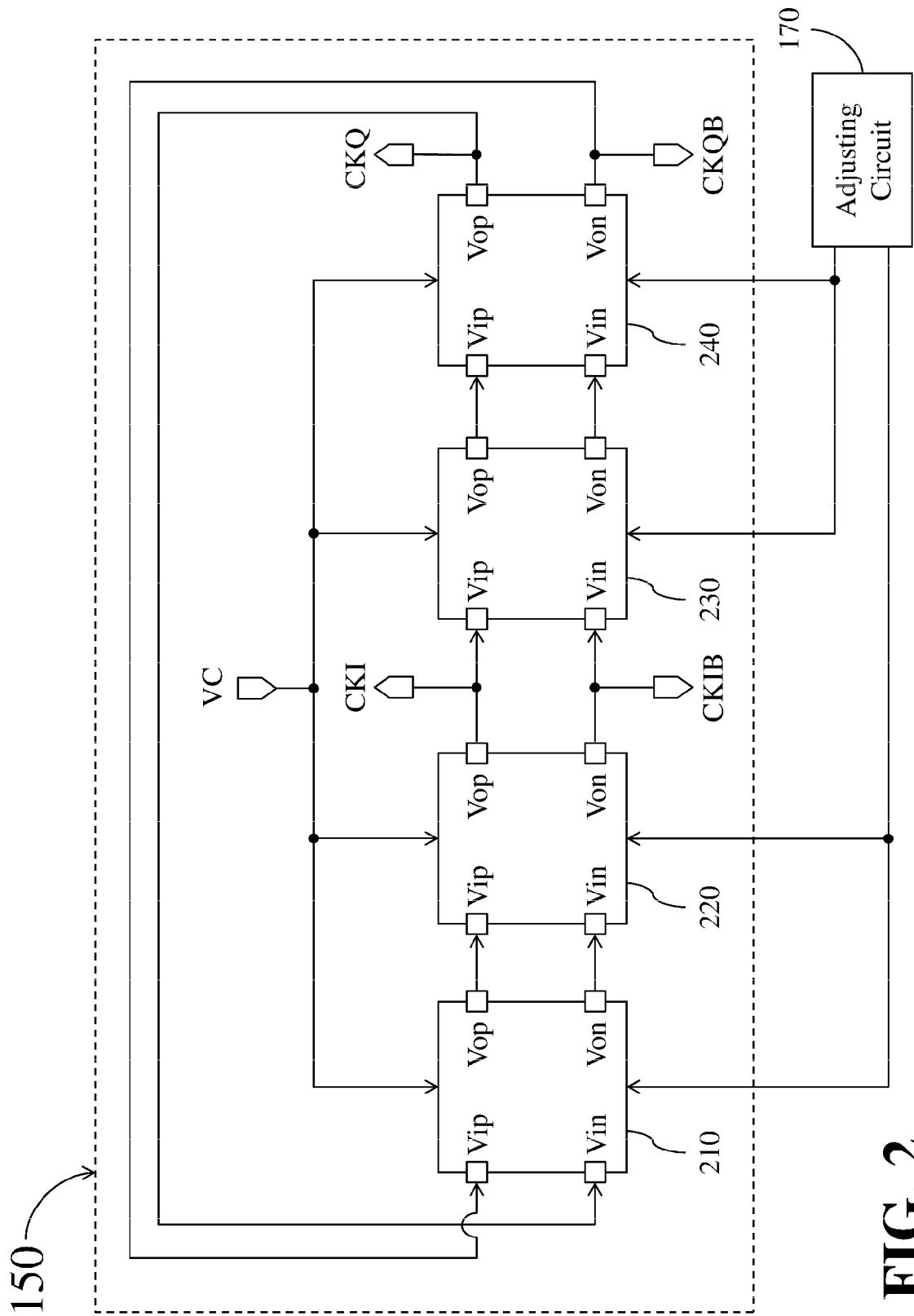
FIG. 2 shows a simplified functional block diagram of a voltage-controlled oscillator in FIG. 1 according to one embodiment of the present disclosure.

FIG. 2 shows a simplified functional block diagram of the voltage-controlled oscillator 150 according to one embodiment of the present disclosure. FIG. 3 shows a simplified functional block diagram of a first oscillator cell 210 in the voltage-controlled oscillator 150 according to one embodiment of the present disclosure.

As shown in FIG. 2, the voltage-controlled oscillator 150 comprises multiple oscillator cells 210~240, and the oscillator cells 210~240 may be divided into a first oscillator cell group and a second oscillator cell group. In this embodiment, the first oscillator cell group comprises the first oscillator cell 210 and a second oscillator cell 220, while the second oscillator cell group comprises a third oscillator cell 230 and a fourth oscillator cell 240.

In the embodiment of FIG. 2, the input terminals Vip and Vin of the second oscillator cell 220 are respectively coupled with the output terminals Vop and Von of the first oscillator cell 210. The input terminals Vip and Vin of the third oscillator cell 230 are respectively coupled with the output terminals Vop and Von of the second oscillator cell 220. The input terminals Vip and Vin of the fourth oscillator cell 240 are respectively coupled with the output terminals Vop and Von of the third oscillator cell 230. The output terminals Vop and Von of the fourth oscillator cell 240 are respectively coupled with the input terminals Vin and Vip of the first oscillator cell 210. In other words, the oscillator cells 210~240 constitute a ring oscillator.

In the voltage-controlled oscillator 150, the output terminals Vop and Von of the second oscillator cell 220 are respectively utilized for providing the differential data sampling clocks CKI and CKIB, while the output terminals Vop and Von of the fourth oscillator cell 240 are respectively utilized for providing the differential edge sampling clocks CKQ and CKQB.

Figure 3:
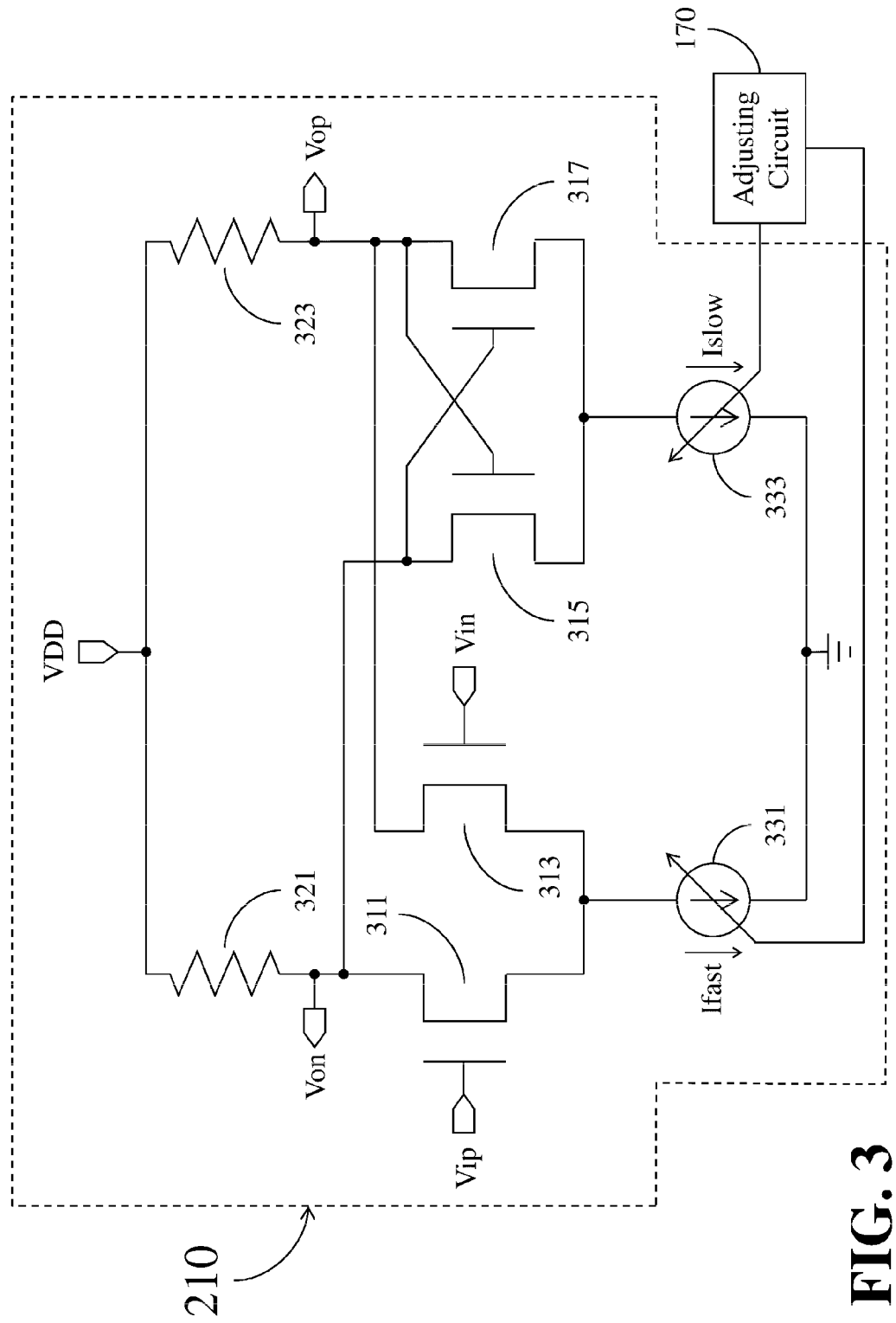
FIG. 3 shows a simplified functional block diagram of an oscillator cell in the voltage-controlled oscillator of FIG. 2 according to one embodiment of the present disclosure.

As shown in FIG. 3, the first oscillator cell 210 comprises a first transistor 311, a second transistor 313, a third transistor 315, a fourth transistor 317, a first resistor 321, a second resistor 323, a first current source 331, and a second current source 333.

In the first oscillator cell 210, the first terminal of the first resistor 321 is coupled with the operating voltage VDD, while the second terminal of the first resistor 321 is coupled with the first terminal of the first transistor 311 and the first terminal of the third transistor 315. The first terminal of the second resistor 323 is coupled with the operating voltage VDD, while the second terminal of the second resistor 323 is coupled with the first terminal of the second transistor 313 and the first terminal of the fourth transistor 317.

The first current source 331 is coupled with the second terminal of the first transistor 311 and the second terminal of the second transistor 313. The second current source 333 is coupled with the second terminal of the third transistor 315 and the second terminal of the fourth transistor 317.

The input terminals Vip and Vin of the first oscillator cell 210 are respectively coupled with the control terminal of the first transistor 311 and the control terminal of the second transistor 313. Additionally, the output terminals Vop and Von of the first oscillator cell 210 are respectively coupled with the second terminal of the second resistor 323 and the second terminal of the first resistor 321.

The adjusting circuit 170 may control the current magnitude of the first current source 331 and the second current source 333 to adjust the signal delay between the signals at the input terminal and the output terminal of the first oscillator cell 210. For example, the adjusting circuit 170 may increase the magnitude of the current Ifast of the first current source 331 or decrease the magnitude of the current Islow of the second current source 333, so as to simultaneously reduce the signal delay between the input terminal Vip and the output terminal Vop as well as the signal delay between the input terminal Vin and the output terminal Von. Alternatively, the adjusting circuit 170 may decrease the magnitude of the current Ifast of the first current source 331 or increase the magnitude of the current Islow of the second current source 333, so as to simultaneously increase the signal delay between the input terminal Vip and the output terminal Vop as well as the signal delay between the input terminal Vin and the output terminal Von.

For the first oscillator cell 210, the signal delay between the input terminal Vip and the output terminal Vop would be the same as the signal delay between the input terminal Vin and the output terminal Von due to the symmetry of the circuit structure.

Each of the other oscillator cells 220~240 in the voltage-controlled oscillator 150 has the same circuit structure as the first oscillator cell 210. Accordingly, the foregoing descriptions regarding the circuit structure of the first oscillator cell 210 are also applicable to the other oscillator cells 220~240.

In one embodiment, the sum of the magnitudes of the current Ifast of the first current source 331 and the current Islow of the second current source 333 is a fixed value. In this situation, the control values utilized by the adjusting circuit 170 to control the distribution ratio of the current Ifast and the current Islow may be realized in the form of binary codes or thermal codes. For example, the adjusting circuit 170 may utilize a greater control value to increase the magnitude of the current Ifast and to correspondingly decrease the magnitude of the current Islow, so as to reduce the signal delay of the oscillator cells to thereby increase the oscillating frequency of the oscillator cells. On the contrary, the adjusting circuit 170 may utilize a smaller control value to decrease the magnitude of the current Ifast and to correspondingly increase the magnitude of the current Islow, so as to increase the signal delay of the oscillator cells to thereby lower the oscillating frequency of the oscillator cells.

In an initial stage, the control voltage VC of the voltage-controlled oscillator 150 may be configured to a fixed voltage level, and the adjusting circuit 170 may utilize a same initial control value to control all the oscillator cells 210~240 in the voltage-controlled oscillator 150 to begin the oscillating operations. In this stage, the frequency detection circuit 160 may compare the frequency of the reference clock RCK with the oscillating frequency of the voltage-controlled oscillator 150 (such as the frequency of the data sampling clock CKI), and control the adjusting circuit 170 to adjust the oscillating frequency of the voltage-controlled oscillator 150 until a difference between the frequency of the reference clock RCK and the oscillating frequency of the voltage-controlled oscillator 150 is less than a predetermined threshold.

For example, if the oscillating frequency of the voltage-controlled oscillator 150 (such as the frequency of the data sampling clock CKI) is higher than the frequency of the reference clock RCK, the frequency detection circuit 160 may control the adjusting circuit 170 to reduce the initial value. On the contrary, if the oscillating frequency of the voltage-controlled oscillator 150 (such as the frequency of the data sampling clock CKI) is lower than the frequency of the reference clock RCK, the frequency detection circuit 160 may control the adjusting circuit 170 to increase the initial control value. As a result, the oscillating frequency of the voltage-controlled oscillator 150 would be locked to a target frequency (i.e., the frequency of the reference clock RCK).

In this situation, the adjusting circuit 170 completes the configuration of the initial control value.

In other words, the adjusting circuit 170 utilizes the same control value to control the signal delay of all oscillator cells 210~240 of the voltage-controlled oscillator 150 in the initial stage.

As described previously, the eye diagram of the input data DIN is often not an ideal symmetric eye in real environment, and the hold time issue typically occurs in the edge sampling circuit 130. Therefore, the half-rate clock data recovery circuit 100 would enter a testing stage once the initial stage is finished.

The testing stage may be divided into multiple test periods. The adjusting circuit 170 may dynamically control the voltage-controlled oscillator 150 to configure the phase difference between the data sampling clock CKI and the edge sampling clock CKQ to be different from 90 degrees in the multiple test periods. Specifically, in each test period, the adjusting circuit 170 may utilize a first control value CTRL_A to control the signal delay of the oscillator cells 210~220 in the first oscillator cell group, while utilize a different second control value CTRL_B to control the signal delay of the oscillator cells 230~240 in the second oscillator cell group. As a result, the phase difference between the data sampling clock CKI (or CKIB) and the edge sampling clock CKQ (or CKQB) can be manipulated to be greater than or less than 90 degrees, instead of being fixed to 90 degrees.

The control circuit 180 further instructs the adjusting circuit 170 to configure the difference between the first control value CTRL_A and the second control value CTRL_B to be different in different test periods. For example, the control circuit 180 may instruct the adjusting circuit 170 to respectively utilize different control value combinations (i.e., at least one of the first control value CTRL_A and the second control value CTRL_B is changed) to control the voltage-controlled oscillator 150 in the multiple test periods. In addition, the control circuit 180 may record multiple recovered-signal quality indicators RSQIs respectively generated by the data processing circuit 102 in the multiple test periods in the storage device 190, and also record the control value combination corresponding to each recovered-signal quality indicators RSQI in the storage device 190.

After the aforementioned multiple test periods, the control circuit 180 may review the records recorded in the storage device 190, and then instruct the adjusting circuit 170 to utilize a control value combination corresponding to the best quality indicator among the multiple recovered-signal quality indicators to control the voltage-controlled oscillator 150, so as to reduce an error rate of the clock data signal DOUT.

In practice, the quantity of the oscillator cells in the voltage-controlled oscillator 150 may be expended to a larger number, such as eight or sixteen, based on the actual requirement.

It can be appreciated from the foregoing descriptions that since the adjusting circuit 170 purposely manipulates the phase difference between the data sampling clock and the edge sampling clock generated by the voltage-controlled oscillator 150 to be different from 90 degrees, the drawback of the conventional half-rate clock data recovery circuit can be effective avoided.

Additionally, the cooperation of the control circuit 180 and the adjusting circuit 170 enables the half-rate clock data recovery circuit 100 to change the signal delay of each oscillator cell in the voltage-controlled oscillator 150 depending upon the actual situation of the input data DIN.

Hence, the phases of the resulting data sampling clock and edge sampling clock can be dynamically adjusted in response to the real condition of the input data DIN. As a result, the recovered data can have better quality compared to the related art.

In other words, even if the eye diagram of the input data DIN is not an ideal symmetric eye, or even if hold time issue occurs in the edge sampling circuit 130, the disclosed half-rate clock data recovery circuit 100 can still achieve best sampling accuracy by dynamically changing the phases of the data sampling clock and the edge sampling clock.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The tem "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A half-rate clock data recovery circuit for providing a clock data signal to a data processing circuit, the half-rate clock data recovery circuit comprising:
   a control voltage generating circuit arranged to operably generate a control voltage;
   a data sampling circuit arranged to operably conduct a data sampling operation on an input data based on a data sampling clock to generate the clock data signal;
   an edge sampling circuit arranged to operably conduct an edge sampling operation on the input data based on an edge sampling clock to generate an edge-sampled signal;
   a phase detection circuit, coupled with the control voltage generating circuit, the data sampling circuit, and the edge sampling circuit, arranged to operably compare data consistency of the clock data signal and the edge-sampled signal with respect to adjacent sampling points of time so as to control the control voltage generating circuit to adjust the control voltage;
   a voltage-controlled oscillator, coupled with the control voltage generating circuit, arranged to operably generate the data sampling clock and the edge sampling clock according to the control voltage;
   an adjusting circuit, coupled with the voltage-controlled oscillator, arranged to dynamically control the voltage-controlled oscillator to configure a phase difference between the data sampling clock and the edge sampling clock to be different from 90 degrees in multiple test periods; and
   a control circuit, coupled with the adjusting circuit, arranged to operably instruct the adjusting circuit to respectively utilize different control value combinations to control the voltage-controlled oscillator in the multiple test periods, and to operably record multiple recovered-signal quality indicators respectively corresponding to the multiple test periods and generated by the data processing circuit;
   wherein after the multiple test periods, the control circuit instructs the adjusting circuit to utilize a control value combination corresponding to a best quality indicator among the multiple recovered-signal quality indicators to control the voltage-controlled oscillator so as to reduce an error rate of the clock data signal.

2. The half-rate clock data recovery circuit of claim 1, further comprising:
   a frequency detection circuit, coupled with the voltage-controlled oscillator and the adjusting circuit, arranged to operably control the adjusting circuit to adjust an oscillating frequency of the voltage-controlled oscillator in an initial stage until a difference between a frequency of a reference clock and the oscillating frequency of the voltage-controlled oscillator is less than a predetermined threshold.

3. The half-rate clock data recovery circuit of claim 1, wherein the voltage-controlled oscillator comprises multiple oscillator cells that is divided into a first oscillator cell group and a second oscillator cell group, and the adjusting circuit utilizes a first control value to control a signal delay of oscillator cells in the first oscillator cell group while utilizes a different second control value to control a signal delay of oscillator cells in the second oscillator cell group.

4. The half-rate clock data recovery circuit of claim 3, wherein the control circuit instructs the adjusting circuit to configure a difference between the first control value and the second control value to be different in different test periods.

5. The half-rate clock data recovery circuit of claim 4, wherein the first oscillator cell group comprises a first oscillator cell and a second oscillator cell while the second oscillator cell group comprises a third oscillator cell and a fourth oscillator cell;
   wherein an input terminal of the second oscillator cell is coupled with an output terminal of the first oscillator cell, an input terminal of the third oscillator cell is coupled with an output terminal of the second oscillator cell, while an input terminal of the fourth oscillator cell is coupled with an output terminal of the third oscillator cell.

6. The half-rate clock data recovery circuit of claim 5, wherein the data sampling clock is provided by one output terminal of the second oscillator cell while the edge sampling clock is provided by one output terminal of the fourth oscillator cell.

* * * * *